(12) United States Patent
Burns et al.

(10) Patent No.: US 7,344,030 B2
(45) Date of Patent: Mar. 18, 2008

(54) WAFER CARRIER WITH APERTURED DOOR FOR CLEANING

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 15 days.

(21) Appl. No.: 10/983,107

(22) Filed: Nov. 5, 2004

(65) Prior Publication Data

US 2005/0115591 A1 Jun. 2, 2005

Related U.S. Application Data

(60) Provisional application No. 60/518,238, filed on Nov. 7, 2003, provisional application No. 60/518,188, filed on Nov. 7, 2003.

(51) Int. Cl.
*B65D 85/48* (2006.01)
(52) U.S. Cl. .......................... 206/710; 206/454
(58) Field of Classification Search ........ 206/710–711, 206/454; 211/41.18; 414/217–217.1
See application file for complete search history.

(56) References Cited

U.S. PATENT DOCUMENTS

| | | | | |
|---|---|---|---|---|
| 5,173,273 A | * | 12/1992 | Brewer | 206/439 |
| 5,711,427 A | * | 1/1998 | Nyseth | 206/710 |
| 5,713,711 A | * | 2/1998 | McKenna et al. | 414/217.1 |
| 5,785,186 A | * | 7/1998 | Babbs et al. | 211/41.18 |
| 5,915,562 A | * | 6/1999 | Nyseth et al. | 206/710 |
| 5,957,292 A | * | 9/1999 | Mikkelsen et al. | 206/710 |
| 6,248,177 B1 | | 6/2001 | Halbmaier | |
| 6,267,245 B1 | * | 7/2001 | Bores et al. | 206/711 |
| 6,412,502 B1 | | 7/2002 | Bexten et al. | |
| 6,749,067 B2 | | 6/2004 | Eggum | |
| 6,808,352 B2 | * | 10/2004 | Seita | 414/217.1 |
| 6,880,718 B2 | | 4/2005 | Eggum | |
| 6,945,405 B1 | | 9/2005 | Bores et al. | |
| 2005/0111935 A1 | * | 5/2005 | Kim et al. | 414/217 |

* cited by examiner

*Primary Examiner*—Bryon P Gehman
(74) *Attorney, Agent, or Firm*—Patterson, Thuente, Skaar & Christensen, P.A.

(57) ABSTRACT

A wafer carrier door having an inner door portion and an outer door portion. The inner door portion has a substantially continuous inner surface. The outer door portion extends over at least a portion of the inner door portion. The outer door portion has a plurality of apertures formed therein. The outer door portion is attached to the inner door portion.

21 Claims, 2 Drawing Sheets

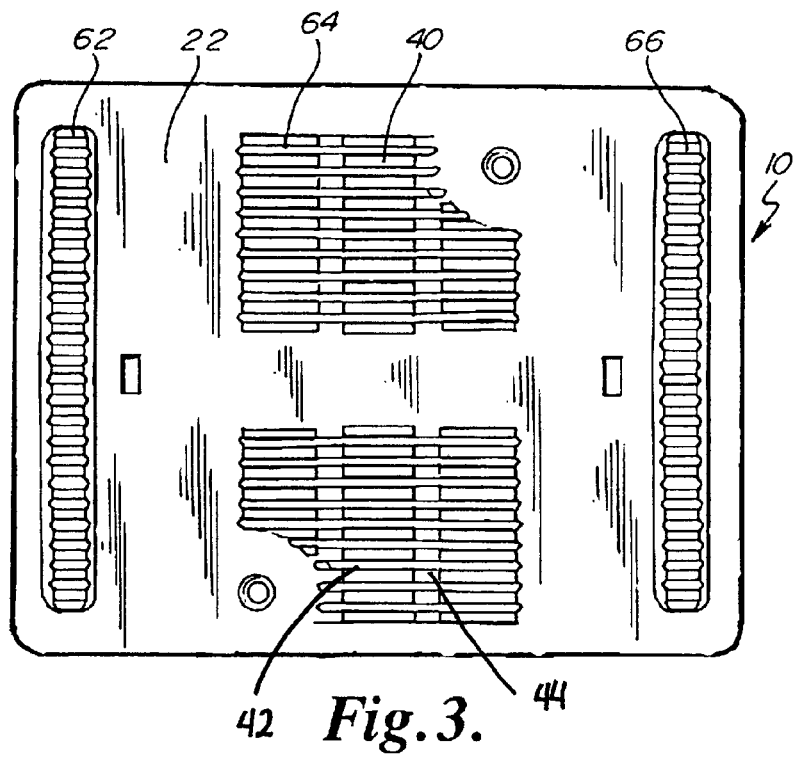
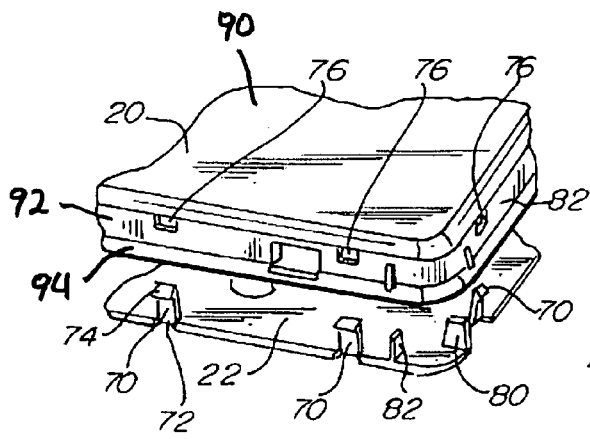
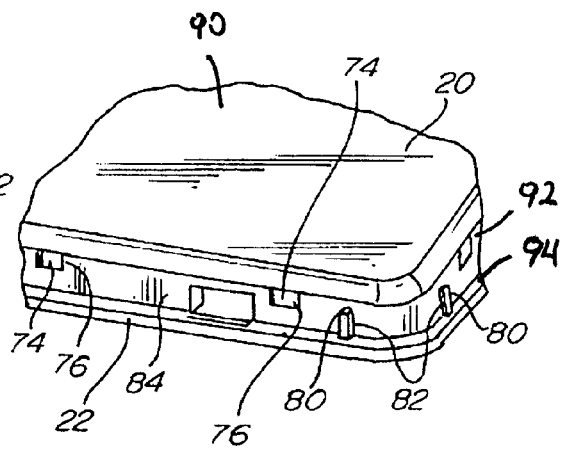

WAFER CARRIER WITH APERTURED DOOR FOR CLEANING

REFERENCE TO RELATED APPLICATIONS

This application claims priority under 35 U.S.C. § 119(e) to, and hereby incorporates by reference U.S. Provisional Application No. 60/518,238, filed Nov. 7, 2003, and U.S. Provisional Application No. 60/518,188, filed Nov. 7, 2003.

FIELD OF THE INVENTION

The present invention relates generally to a system for handling semiconductor wafers. More particularly, the present invention relates to a door for a wafer carrier.

BACKGROUND OF THE INVENTION

Semiconductor wafers are subjected to numerous steps during processing. This process usually entails transporting the wafers from one workstation to another for processing by specialized equipment.

As part of this process, wafers may be temporarily stored or shipped in containers to other plants or to ends users. During these phases, the wafers may be subjected to contaminants that damage the wafers.

To reduce the deleterious effect of contaminants on wafers, specialized containers have been developed to minimize the generation of contaminants and to isolate the wafers from contaminants exterior to the containers. A principal feature common to these devices is that they are provided with removable doors or closures.

There are several problems associated with the above-mentioned wafer handling containers. During the working life of the containers, the closure or door is attached and removed many times by both robotic and manual means. With each attachment or removal, a portion of the door edge may scrape against the door frame of the container. This repeated process can result in the generation of loose particles that may become airborne to lodge on the wafers stored in the container.

The problem of particle generation may also be attributed to the process by which doors and containers are manufactured. Containers and doors are usually formed by injection molding with plastic such as polycarbonate. Inherent in such molding is shrinkage and warpage of the molded parts.

Although plastic injection molding techniques are highly advanced, there still may be individual deviations between different components from the same mold. While slight deviations do not generally compromise the function of a door in closing a container, they can change the working dimensions to the extent that contact (and the resultant particle generation) between a door and a door frame is increased. Dimensional changes can also be generated by the dies themselves, as a result of normal wear and tear. This problem is accentuated when the tolerances of the components of doors and containers are stacked or added.

As the semiconductor industry has evolved, wafers, and thus wafer carriers have increased significantly in size. Semiconductor fabrication facilities are now processing 300 mm wafers. The larger carriers for 300 mm wafers amplify the warpage, shrinkage, and tolerance issues in molded carriers.

To minimize build up of contaminants on the components of the wafer carrier, the wafer carrier is subjected to a thorough cleaning prior to reuse. Cleaning optimally not only removes contaminants on the outer and inner surfaces of the wafer carrier but also from any interior cavities.

In an effort to reduce the generation of contaminants caused by rubbing together of the wafer carrier enclosure and the wafer carrier door, door guides have been created that attach to the corners of the wafer carrier door. Examples of door guides are described in U.S. Pat. Nos. 6,206,196 and 6,464,081, which are both assigned to the assignee of the present application and are incorporated herein by reference.

SUMMARY OF THE INVENTION

The invention is directed to a wafer carrier door for use with a wafer carrier enclosure. The wafer carrier door includes an inner door portion and an outer door portion. In a first embodiment of the invention, the outer door portion includes a plurality of apertures formed therein to facilitate cleaning a cavity between the inner door portion and the outer door portion.

In a second embodiment of the invention, the outer door portion includes a plurality of door guides extending therefrom. The inner door portion includes a plurality of door guide recesses formed therein. When the inner door portion is attached to the outer door portion, the door guides extend through the door guide apertures so that the door guides contact the wafer carrier enclosure when the wafer carrier door is attached to the wafer carrier enclosure.

BRIEF DESCRIPTION OF THE DRAWINGS

FIG. 3 is an outer view of the wafer carrier door.

FIG. 4 is an enlarged view of a corner of the wafer carrier door with inner and outer door portions in an unassembled configuration.

FIG. 5 is an enlarged view of the corner of the wafer carrier door with the inner and outer door portions in an assembled configuration.

DETAILED DESCRIPTION OF THE PREFERRED EMBODIMENTS

Figure 1:
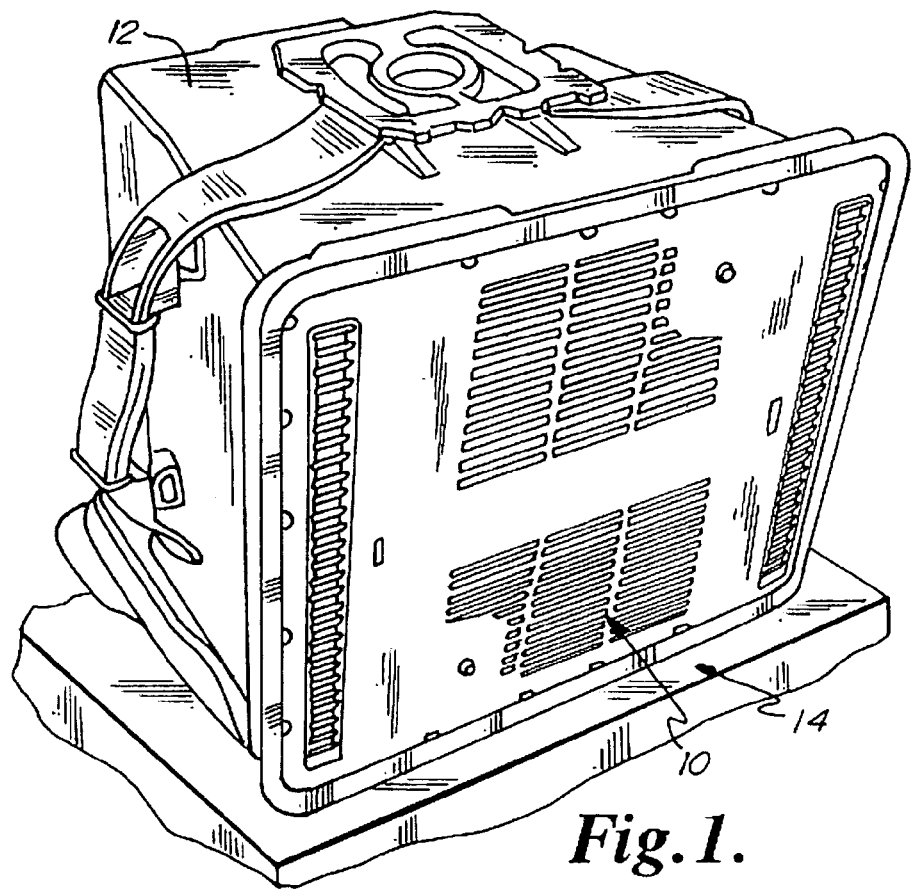
FIG. 1 is a wafer carrier using a door according to the invention.

An embodiment of the invention is a wafer carrier door, as most clearly illustrated at 10 in FIG. 1. The wafer carrier door 10 substantially seals a wafer carrier enclosure 12 to retain semiconductor wafers (not shown) in the wafer carrier 14.

The wafer carrier door 10 of the present invention enhances the ability to efficiently clean the wafer carrier door 10 between uses. The wafer carrier door 10 also reduces contaminant generation during opening and closing the wafer carrier 14. The wafer carrier door 10 also provides door guides 80 that reduce contaminant generation caused by frictional engagement between the wafer carrier door 10 and the wafer carrier enclosure 12.

Figure 2:
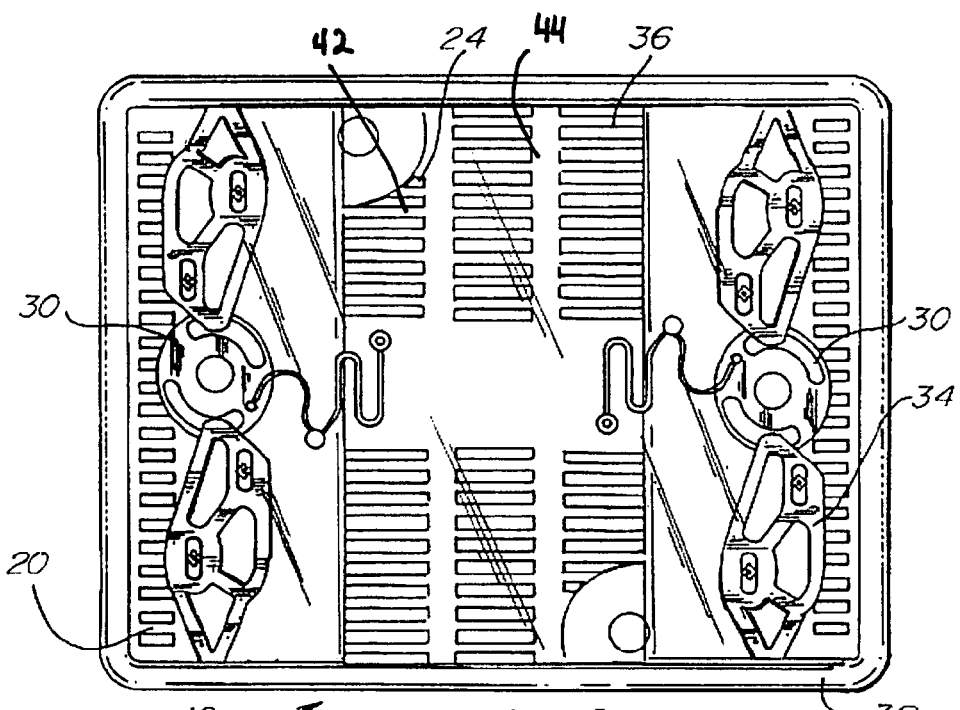
FIG. 2 is an inner view of the wafer carrier door.

The wafer carrier door 10 includes an inner door portion 20 and an outer door portion 22, as illustrated in FIGS. 2 and 3. The inner door portion 20 and the outer door portion 22 mate together to form a cavity 24 therebetween.

At least one locking mechanism 30 is mounted in the cavity 24 as is visible through the inner door portion 20. The at least one locking mechanism 30 facilitates attachment of the wafer carrier door 10 to the wafer carrier enclosure 12. Mounting the at least one locking mechanism 30 in the cavity 24 protects the at least one locking mechanism 30 from damage during use of the wafer carrier 14.

The inner door portion 20 is preferably substantially continuous to prevent contaminants from entering the wafer carrier enclosure 12 through the inner door portion 20. To further facilitate forming a seal between the wafer carrier door 10 and the wafer carrier enclosure 12, a resilient gasket 32 may be provided around an outer edge 34 of the inner door portion 20.

The inner door portion 20 preferably includes a rectangularly shaped recess 36 proximate a center thereof. The rectangularly shaped recess 36 is preferably shaped to receive a wafer cushion (not shown) such as is disclosed in U.S. Pat. No. 6,267,245, which is assigned to the assignee of the present application.

The outer door portion 22 preferably has a shape that substantially corresponds with the outer dimensions of the inner door portion 20 so that the outer door portion 22 substantially covers the inner door portion 20 when the wafer carrier door 10 is attached to the wafer carrier enclosure 12.

The outer door portion 22 has a plurality of apertures 40 formed therein. The apertures 40 facilitate removing contaminants from the cavity 24 when the wafer carrier door 10 is cleaned between uses. The apertures 40 also facilitate readily removing the cleaning fluid from the cavity 24 when the cleaning process is completed. The apertures 40 preferably extend over at least 25 percent of the surface of the outer door portion 22 and more preferably over at least 50 percent of the surface of the outer door portion 22.

The apertures 40 preferably have an elongate configuration and are oriented along sides of the at least one locking mechanism 30 as rubbing of components during operation of the at least one locking mechanism 30 has the potential of generating contaminants. The apertures 40 are preferably oriented in three groups—a first side group 62, a central group 64 and a second side group 66. The apertures 40 preferably extend over at least 50 percent of the surface of the outer door portion 22.

Through the use of an array of apertures 40 in the outer door portion 22 enables the wafer carrier to exhibit the simultaneous benefits of discharging potentially hazardous static while being able to view objects in the wafer carrier 18 without opening the wafer carrier 18.

The apertures 40 are preferably arranged in an array that is defined by a plurality of horizontal portions 42 and a plurality of vertical portions 44. The plurality of horizontal portions 42 and the plurality of vertical portions 44 are preferably arranged in a substantially perpendicular configuration. A width of each horizontal portion 42 is preferably less than a width of the apertures 40.

The apertures 40 preferably have a length that is greater than a width to facilitate flowing the cleaning fluid through the interior of the wafer carrier door 10 in a direction that is generally parallel to the length of the apertures 40.

The horizontal portions 42 and the vertical portions 44 are fabricated with a width and thickness to provide the wafer carrier door 10 with a sufficient level of structural rigidity to resist deformation during conventional use conditions.

Because of the potential damage to semiconductor components static charges, it is known to fabricate components of wafer carriers from materials that dissipate such charges. Typically materials that exhibit desired levels of ESD are not transparent. Forming the wafer carrier door from non-transparent materials impedes the ability to view items stored inside of the wafer carrier. To overcome this limitation, transparent regions have been formed in an otherwise non-transparent wafer carrier door.

While it is possible for the apertures 40 to cover substantially all of the surface of the outer door portion 22, the apertures 40 are preferably not located above the lock mechanism 30. In this configuration an inner surface of the outer door portion 22 that is below the lock mechanism 30 is substantially flat to facilitate smooth operation of the lock mechanism 30.

Another way of looking at the wafer carrier of the present invention is that it is applicable to a wafer container comprising an inner shell creating a hermetic containment and the array, cage, or grid spaced from the inner transparent shell and extending over at least a portion of the inner transparent shell. The cage, array, or grid has a plurality of apertures formed therein. The cage thereby protects the inner shell from contact and from one or more hazards such as electro static shocks and abrasion while allowing a person to see the wafer carrier and preferably to see objects that are inside of the wafer carrier.

The outer door portion 22 is preferably secured to the inner door portion 20 using a plurality of tabs 70 that extend from the outer door portion 22, as most clearly illustrated in FIGS. 4 and 5. The tabs 70 preferably include a main section 72 and an end section 74 that extends from the main section 72 opposite the outer door portion 22.

The inner door portion 20 generally includes a central panel 90 and a side panel 92 that extends substantially perpendicular from the central panel 90. The side panel 92 preferably extends substantially around the central panel 90. Opposite the central panel 90, a lip 94 extends from the side panel 92. The lip 94 is preferably oriented substantially perpendicular to the side panel 92.

At least one of the side panel 92 and the lip 94 include tab apertures 76 that are shaped to approximately conform to a size of the tabs 70. This configuration permits the end sections 74 of the tabs 70 to extend through the tab apertures 76. The end sections 74 then seat in the tab apertures 76 to retain the inner door portion 20 in a stationary portion with respect to the outer door portion 22, as most clearly illustrated in FIG. 5.

When the inner door portion 20 is attached to the outer door portion 22, the tabs 70 may beyond the inner door portion 20 so that the tabs 70 contact the wafer carrier enclosure 12 when the wafer carrier door 10 is attached to the wafer carrier enclosure 12. This configuration reduces frictional contact between the inner door portion 20 and the wafer carrier enclosure 12.

The outer door portion 22 also preferably includes a plurality of corner guides 80 extending therefrom. The corner guides 80 preferably extend substantially straight from the outer door portion 22 as illustrated in FIG. 4. The corner guides 80 are preferably oriented substantially normal to an edge of the outer door portion 22 to which the corner guide 80 is adjacent. Each side of the outer door portion 22 preferably includes one of the corner guides 80 proximate each end thereof.

The inner door portion 20 also preferably includes corner guide apertures 82 that are shaped to approximately conform to a size of the corner guides 80. This configuration permits the corner guides 80 to extend through the corner guide apertures 82. When the inner door portion 20 is attached to the outer door portion 22, the corner guides 80 extend beyond a side wall 84 of the inner door portion 20. The corner guides 80 are preferably fabricated from a material that minimizes frictional engagement with the wafer carrier enclosure 12.

Using this configuration, frictional contact between the inner door portion 20 and the wafer carrier enclosure 12 is substantially eliminated. This process also reduces the number of parts compared to the prior art corner guides that were independently formed from the inner door portion and the outer door portion.

The inner door portion 20 and outer door portion 22 are both preferably fabricated using injection molding. The inner door portion 20 and the outer door portion 22 are preferably fabricated from polycarbonate, polyetherimide, polyetheretherketone or other materials known to one of ordinary skill in the art.

It is contemplated that features disclosed in this application, as well as those described in the above applications incorporated by reference, can be mixed and matched to suit particular circumstances. Various other modifications and changes will be apparent to those of ordinary skill.

The invention claimed is:

1. A front opening wafer container, comprising a wafer carrier enclosure with a front opening and a wafer carrier door sized to sealingly close the front opening, the wafer carrier door comprising:
   an inner door portion having a substantially continuous inner surface, the inner door portion comprising a central panel and a side panel extending perpendicularly from the central panel, the inner door portion being substantially continuous and having outer dimensions; and
   an outer door portion substantially corresponding with the outer dimensions of the inner door portion, the outer door portion connecting to and extending over and substantially covering the inner door portion thereby defining a single cavity therebetween;
   a pair of locking mechanisms for securing the door to the wafer carrier enclosure, the locking mechanisms positioned in the cavity between the inner door portion and the outer door portion, one of said pair of locking mechanisms located at the left side of the door and other of said pair located at the right side of said door; and
   wherein the outer door portion has a plurality of apertures formed therein for facilitating cleaning the cavity between the inner door portion and the outer door portion, the apertures each being elongate with a length and a width, the length being positioned horizontally, the apertures being arranged in parallel, a group of apertures positioned on the left side of the door and arranged as a column extending substantially the height of the door, said group of apertures enabling removal of contaminates generated by any of said pair of locking mechanisms, another group of apertures positioned on the right side of the door and arranged as a column extending substantially the height of the door, said another group of apertures enabling removal of contaminates generated by any of said pair of locking mechanisms, the outer door having portions not having apertures.

2. The front opening wafer container of claim 1, wherein the outer door portion has a surface area and the apertures extend over at least 50 percent of the surface area of the outer door portion.

3. The front opening wafer container of claim 1, wherein the groups of apertures are oriented in three arrays, each having a plurality of apertures aligned vertically.

4. The front opening wafer container of claim 1, wherein each of the columns have six apertures arranged in a grouping, the grouping extending vertically on the door.

5. The front opening wafer container of claim 1, wherein the apertures are defined by a plurality of horizontal portions and a plurality of vertical portions, defining a gridwork.

6. The front opening wafer container of claim 1, wherein at least a portion of the outer door portion is fabricated from a non-transparent material.

7. The front opening wafer container of claim 1, wherein at least a portion of the outer door portion is fabricated from a static dissipative material and the inner door portion is fabricated of transparent plastic, whereby wafers positioned in the wafer container are viewable through the front door by way of the apertures.

8. A wafer carrier comprising:
   a wafer carrier enclosure having a door opening for accessing wafers contained in the enclosure; and
   a wafer carrier door comprising:
   an inner door portion having a central panel and a side panel that extends around said central panel and extends substantially perpendicularly from said central panel, the inner door portion being substantially continuous for preventing contaminants from entering the enclosure;
   an outer door portion substantially covering the inner door portion and defining a single cavity therebetween, wherein the outer door portion has a plurality of elongate apertures parallel with one another; and
   a plurality of locking mechanisms for securing the wafer carrier door to the wafer carrier enclosure, said plurality of locking mechanisms positioned in the cavity between the inner door portion and the outer door portion, wherein the apertures enable removal of contaminates generated by any of said plurality of locking mechanisms.

9. The wafer carrier of claim 8, wherein the apertures extend over at least 30 percent of the surface area of the outer door portion.

10. The wafer carrier of claim 8, wherein the apertures are oriented in an array having at least two columns.

11. The wafer carrier of claim 8, wherein there are three groupings of apertures.

12. The wafer carrier of claim 8, wherein the apertures are defined by a plurality of horizontal portions and a plurality of vertical portions defining a gridwork.

13. The wafer carrier of claim 8, wherein the apertures are arranged in a first side group, a central group, and a second side group, wherein the first side group is located proximate a first side of the outer door portion, wherein the second side group is located proximate a second side of the outer door portion, which is opposite the first side, and wherein the central group is located intermediate the first side group and the second side group.

14. The wafer carrier of claim 8, and further comprising a pair of lock mechanisms mounted to the door.

15. A wafer carrier door comprising:
   an inner door portion being continuous and formed from a transparent material;
   an outer door portion formed from a static dissipative material, wherein the outer door portion has an array of apertures formed therein, the apertures each being elongate with the greater dimension disposed horizontally, the apertures arranged in parallel alignment wherein the outer door portion mates with the inner door portion forming a single cavity therein; and
   a pair of locking mechanisms positioned in said cavity, one of said latching mechanisms located at the left side of the door and the other of said latching mechanisms located at the right side of said door, wherein the apertures enable removal of contaminates generated by any of said pair of locking mechanisms.

16. The wafer carrier door of claim 15, wherein the apertures extend over at least 30 percent of the surface area of the outer door portion.

17. The wafer carrier door of claim 15, wherein the apertures are oriented in an array having at least two columns and a plurality of rows.

18. The wafer carrier door of claim 15, and further comprising a lock mechanism mounted to at least one of the inner door portion and the outer door portion at least partially between the inner door portion and the outer door portion.

19. The wafer carrier door of claim 15, wherein a portion of the outer door portion is fabricated from a non-transparent material.

20. A front opening wafer container comprising an enclosure and a wafer carrier door, the wafer carrier door comprising:

an outer door portion having a grid thereon, the grid defining a array of apertures;

an inner door portion spaced from the outer door portion and defining, with said outer door portion, a single cavity, the cavity extending substantially the entire height and width of the door; and a pair of locking mechanisms mounted to said door for locking said door to the enclosure, the locking mechanisms both positioned in said cavity, wherein the apertures are positioned proximate said locking mechanisms to facilitate removal of contaminates generated by any of said pair of locking mechanisms.

21. The front opening wafer container of claim 20, wherein the inner door portion is fabricated from a material that is different from the outer door portion.

* * * * *